United States Patent
Brintzinger et al.

(10) Patent No.: US 6,268,638 B1
(45) Date of Patent: Jul. 31, 2001

(54) METAL WIRE FUSE STRUCTURE WITH CAVITY

(75) Inventors: Axel C. Brintzinger, Fishkill; Edward W. Kiewra, Verbank; Chandrasekhar Narayan, Hopewell Junction; Carl J. Radens, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/258,563

(22) Filed: Feb. 26, 1999

(51) Int. Cl.[7] .................................................. H01L 27/02
(52) U.S. Cl. ......................... 257/529; 257/209; 438/132; 438/215; 438/281; 438/323; 438/467; 438/601
(58) Field of Search ..................................... 257/529, 209; 438/132, 215, 281, 323, 467, 601

(56) References Cited

U.S. PATENT DOCUMENTS

| | | |
|---|---|---|
| 3,564,354 | 2/1971 | Aoki et al. . |
| 4,032,949 | 6/1977 | Bierig . |
| 4,089,734 | 5/1978 | Bierig . |
| 4,209,894 | 7/1980 | Keen . |
| 4,460,914 | 7/1984 | Te Velde et al. . |
| 4,536,948 | 8/1985 | Te Velde et al. . |
| 4,879,587 | 11/1989 | Jerman et al. . |
| 4,935,801 | 6/1990 | McClure et al. . |
| 5,241,212 | 8/1993 | Motonami et al. . |
| 5,550,399 | 8/1996 | Okazaki . |
| 5,608,257 | 3/1997 | Lee et al. . |

FOREIGN PATENT DOCUMENTS

| | | |
|---|---|---|
| WO 88/03707 | 5/1988 | (EP) . |
| 2 075 751 | 11/1981 | (GB) . |
| 2 237 446 | 5/1991 | (GB) . |
| 60-134437 | 7/1985 | (JP) . |
| 63-307758 | 12/1988 | (JP) . |
| 1-295439 | 11/1989 | (JP) . |
| 3-46256 | 2/1991 | (JP) . |
| 3-169049 | 7/1991 | (JP) . |
| 7-85771 | 3/1995 | (JP) . |

*Primary Examiner*—Fetsum Abraham
(74) *Attorney, Agent, or Firm*—McGinn & Gibb, PLLC; Daryl K. Neff, Esq.

(57) ABSTRACT

An integrated circuit has primary devices and redundant devices being selective substituted for the primary devices through at least one fuse. The fuse includes a first layer having at least one fuse link region, a second layer over the first layer and cavities in the second layer above the fuse link region.

12 Claims, 3 Drawing Sheets

METAL WIRE FUSE STRUCTURE WITH CAVITY

BACKGROUND OF THE INVENTION

1. Field of the Invention

The present invention generally relates to the fabrication of integrated circuits. More particularly, the present invention relates to improved techniques for increasing circuit density and/or reducing substrate damage in an integrated circuit employing fusible links.

2. Description of Related Art

Semiconductor integrated circuits (IC) and their manufacturing techniques are well known. In a typical integrated circuit, a large number of semiconductor devices may be fabricated on a silicon substrate. To achieve the desired functionality, a plurality of conductors are typically provided to couple selected devices together.

In some integrated circuits, conductive links are coupled to fuses, which may be cut or blown after fabrication using lasers or electrical power. In a dynamic random access memory (DRAM) circuit, for example, fuses may be employed during manufacturing to protect some of the transistors' gate stacks from an inadvertent built-up of charges. Once fabrication of the IC is substantially complete, the fuses may be blown or cut to permit the DRAM circuit to function as if the protective current paths never existed. Alternatively, the fuse links may be used to re-route the conductive lines and hence modify the functionality of the circuit.

Laser fusible links are generally metal lines that can be explosively fused open by application of laser energy. The laser energy causes a portion of the link material to vaporize and a portion to melt. Typically, the fusible link is thin and is made of aluminum or polysilicon or it may be made of the same metals as the chip conductors. In operation, a short pulse of laser energy in predetermined arcs (spot) is impinged upon the link.

Electrically fusible links comprise metal lines that can be fused open by application of electrical power which induces a portion of the link material to vaporize, melt or otherwise be caused to form an electrical discontinuity or "open". Typically, the electrically fusible link is formed of a metallic conductor (such as aluminum) or a polysilicon. In operation, a short pulse of electrical power is applied to induce the fuse to open.

Since every link is not necessarily blown, it is important to ensure that adjacent fuses are not blown by reflected light or thermal energy. Two methods are currently used to ensure that only the desired fuses are blown and that adjacent fuses are not inadvertently blown. The first method simply spaces the fuses two or three spot diameters apart. The second method builds metal walls between the adjacent fuses. Both those methods result in large fuse pitches and significant use of chip area.

In cases where the fusible links: are built from the same material as the chip conductors; become thicker; are made of composite layers including layers of refractory metals (tungsten and various silicides); or are comprised of highly reflective metals (copper/aluminum), blowing the fuses with lasers becomes more difficult.

The increasing speed requirements of logic chips are the driving force behind these fusible link materials. More commonly, fuses may be employed to set the enable bit and the address bit of a redundant array element in a DRAM circuit.

FIG. 1 illustrates a typical dynamic random access memory integrated circuit, having a main memory array 102. To facilitate replacement of a defective main array element within the main memory array 102, a redundant array 104 is provided as shown. A plurality of fuses in a fuse array 106 are coupled to the redundant array 104 via a fuse latch array 108 and a fuse decoder circuit 110. To replace a defective main memory array element, individual fuses in the fuse array 106 may be blown or cut to set their values to either a "1" or a "0" as required by the decoder circuit.

During operation, the values of the fuses in the fuse array 106 are typically loaded into the fuse latch array 108 upon power up. These values are then decoded by the fuse decoder circuit 110 during run time, thereby facilitating the replacement of specific failed main memory array elements with specific redundant elements of the redundant array 104. Techniques for replacing failed main memory array elements with redundant array elements are well known in the art and will not be discussed in great detail here for brevity's sake.

As mentioned above, the fuse links within fuse array 106 may be selectively blown or cut with a laser beam or electrical power. Once blown the fuse changes from a highly conductive state to a highly resistive (i.e., non-conductive) state. A blown fuse inhibits current from flowing through and represents an open circuit to the current path. With reference to FIG. 2A, fuse links 202, 204, 206, and 208 of the fuse array element 106 are shown in their unblown (i.e., conductive) state. In FIG. 2B, a laser beam or electrical power has been employed to cut or blow one fuse link 204, thereby inhibiting the flow of current therethrough.

It has been found that the use of a laser beam to set, cut or blow a fuse link may render the area under the fuse link or adjacent fusible links vulnerable to laser-induced damage, mainly due to the absorption of laser energy during the fuse setting operation. Because of the possibility of laser-induced damage, the areas underlying the fuse links are typically devoid of semiconductor devices (e.g., transistors) and the fuses are spaced far apart in conventional systems.

Even when there are no active devices beneath the fusible link or other closely spaced fusible links, the substrate itself may also experience some degree of laser-induced damage. This is because silicon, which is the typical substrate material, absorbs the laser energy readily, particularly when short wavelength lasers are employed. For this reason, lasers having relatively long wavelengths such as infrared lasers have been employed in conventional systems for the fuse setting operation.

Even though infrared lasers are helpful in minimizing laser-induced damage to the underlying substrate, the use of lasers having relatively long wavelengths involves certain undesirable compromises. By way of example, the relatively long wavelength of the infrared laser forms a relatively large spot on the substrate during the fuse setting operation, which limits how closely the fuse links can be packed next to one another. For infrared lasers having a wavelength of, for example, about 1 micron, the spot created on the substrate may be two times the wavelength or about 2 to 2.5 microns wide.

The disadvantages associated with lasers having relatively long wavelengths is illustrated with reference to FIGS. 3A and 3B below. FIG. 3A is a cross-sectional view of a portion of the fuse array 106, including fuse links 202, 204, 206, and 208. In FIG. 3A, fuse links 202, 204, 206, and 208 are shown encapsulated within a passivation layer 302. A substrate 304 underlies the fuse links as shown. It should be noted that the illustration of FIG. 3A is highly simplified to facilitate illustration, and the fuse array 106 may include other conventional layers and/or components as is known.

In FIG. 3B, fuse link 204 of FIG. 3A has been blown or cut using a laser beam. In place of fuse link 204, a void 310 exists, whose diameter C is roughly twice the wavelength of the laser beam employed. The diameter C of the laser spot places a lower limit on the minimum fuse pitch 312 between adjacent fuse links. If the fuses are placed too closely together for a given laser wavelength, an adjacent fuse link may be inadvertently blown or cut, rendering the IC defective.

Using a laser with a shorter wavelength would reduce the diameter C of the laser spot and concomitantly the minimum fuse pitch. However, a shorter wavelength laser substantially increases the likelihood of underlying substrate damage in conventional systems since the silicon substrate absorbs laser energy from shorter wavelength lasers much more readily. If a shorter wavelength laser is employed to set the fuse links of the conventional system's fuse array 106, excessive substrate damage in area 320 may result, possibly leading to integrated circuit defects and failure.

In view of the foregoing, there is a conventional need for improved techniques for fabricating integrated circuits having laser and or electrically fusible links. More particularly, there is a conventional need for improved laser and/or electrical fuse link structures and methods therefor, which reduce the amount of damage caused when the fuse element blows.

SUMMARY OF THE INVENTION

It is, therefore, an object of the present invention to provide a structure and method for a dynamic random access memory integrated circuit which includes a main memory array having main memory array elements, a redundant memory array, coupled to the main memory array, including redundant memory array elements, at least one laser fuse link selectively substituting at least one of the redundant memory array elements for defective ones of the main memory elements upon application of laser energy and at least one cavity portion positioned between the laser fuse link and a source of the laser energy The laser fuse link can include a first conductive layer and a second conductive layer above the first conductive layer, the cavity portion is within the second conductive layer. The laser fuse link can also include a fuse window allowing the laser energy to reach the fuse link, the cavity is between the fuse link and the fuse window. The cavity directs energy and fuse material from the fuse link toward the fuse window. The dynamic random access memory includes conductive islands within the cavity. The conductive islands concentrate laser energy on the fuse link.

The inventive integrated circuit includes primary devices and redundant devices being selectively substituted for the primary devices through at least one fuse. The fuse also includes a first layer having at least one fuse link region, a second layer over the first layer and a cavity in the second layer positioned with respect to the fuse link region to direct fuse material away from adjacent devices within the integrated circuit. The first layer includes a conductive layer and the second layer also includes a conductive layer. A fuse window allows laser energy to reach the fuse link region. The cavity is between the fuse link region and the fuse window. The cavity directs energy and fuse material from the fuse link region toward the fuse window. The integrated circuit also includes conductive islands within the cavity. The conductive islands concentrate laser energy on the fuse link region.

The method for forming an integrated circuit fuse structure includes forming a fuse link layer, a second layer over the fuse link layer and at least one cavity in the second layer such that the cavity is positioned with respect to the fuse link region to direct fuse material away from adjacent devices within the integrated circuit. The second layer includes deposition processes and the second layer includes damascene processes. An insulating layer is formed over the second layer, wherein the fuse link layer includes a conductive layer and the second layer is a conductive layer. A fuse window over the second layer allows laser energy to reach the fuse link layer, wherein the cavity is between the fuse link layer and the fuse. The cavity directs energy and fuse material from the fuse link layer toward the fuse window. Conductive islands are formed within the cavity. The conductive islands concentrate laser energy on the fuse link.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

In order to avoid damage to surrounding structures when a fuse link blows, a cavity may be formed next to the fuse link to absorb some of the energy and the vaporized fuse material expelled during the fuse clearing process. The invention includes a uniquely and conveniently formed and uniquely located cavity which directs the energy and material from the clearing fuse away from structures which might otherwise be damaged.

Figure 4A:
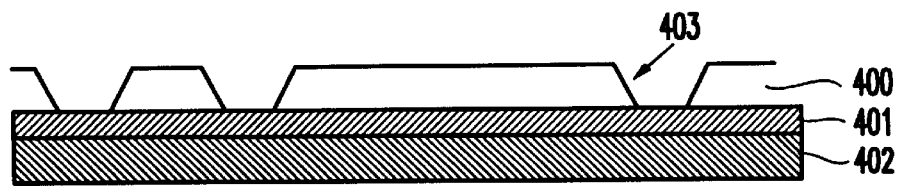
FIGS. 4A–4D illustrate an embodiment of the invention including a cavity region over a fusible link.

More specifically, referring to FIGS. 4A–4D, a first embodiment of the inventive fuse structure/process is illustrated. FIG. 4A illustrates a cross section of a metal wire stack (e.g. a first conductive "R1" structure) formed by conventional deposition techniques, photolithography and plasma etching such as sputtering. The wire stack preferably includes a dielectric substrate 450, a first thin conductive (Ti) under layer 402 that is 5 nm–50 nm thick, a second conductive (AlCu alloy) layer 401 that is 10 nm–1000 nm thick. In this structure the AlCu alloy layer 401 acts as the fusible element or fuse link.

As would be known by one ordinarily skilled in the art given this disclosure, the inventive structure could be formed using any number of similar structures and materials. For example, the conductive layer 402 could be a barrier metal layer formed by a damascene process with a liner underneath. For example, the conductive layer and liner could be formed using deposition and chemical mechanical planarization (CMP) on a dielectric substrate. The substrate would preferably be patterned into the shape of a fuse structure using lithography and etching. In such a damascene structure, the contract would be formed in a portion of the barrier layer which is undercut to form a cavity in a similar manner to the cavity 410 shown in FIG. 4C.

An interlayer dielectric (ILD) layer 400 (e.g., a second contact "C2" layer), such as silicon dioxide, is deposited over the patterned metal stack to a thickness of 10 nm–1000 nm. The C2 layer 400 is transparent to the laser energy which will be applied to the fuse material 402. The ILD layer 400 is patterned using conventional lithography and dry etching techniques, such as reactive ion etching (RIE) using gases such as $CF_4$, $CHF_3$, $C_4F_8$, CO, Ar, $O_2$ and $N_2$ to open regions 403 of the C2 contact 400 to match the layout design.

Figure 4B:
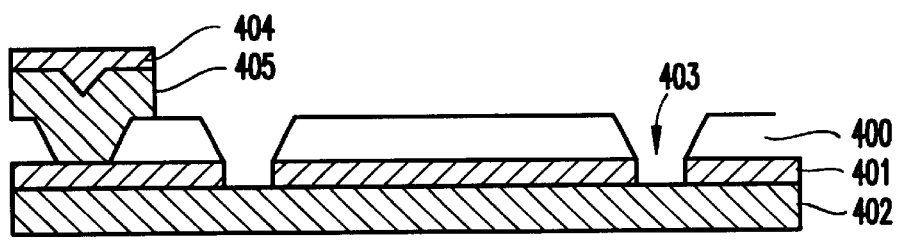

As shown in FIG. 4B, the second conductive "R2" structure, in the form of a similar metal wire stack formed from of an AlCu layer 405 that is 10 nm–1000 nm thick, and a TiN layer 404 that is 10 nm–50 nm thick, is deposited and patterned, using selective deposition and etching techniques, such as lithography and reactive ion etching (RIE) using gases such as $BCl_3$, HCl, $Cl_2$, He, $N_2$, and Ar.

Figure 4C:
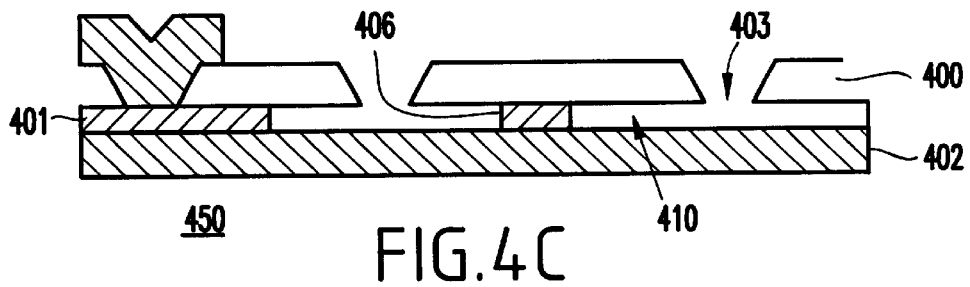

The regions of the TiN layer 401 exposed by the openings 403 in the C2 contact 400 are then etched using an isotropic process, such as a dry etch (containing fluorine) at a temperature of 50° C. to 300° C. Such an etch only affects the TiN layer 401 and does not significantly alter the inter layer dielectric 400 or the fuse material 402. As shown in FIG. 4C, this etching process undercuts the TiN and forms a cavity 410 and islands 406 of TiN between the C2 patterns 400. The TiN islands 406 are allowed to remain in the cavity 410 to help the absorption of the subsequent optical energy in the case of a laser fuse blow and to provide mechanical support of the ILD 400.

Figure 4D:
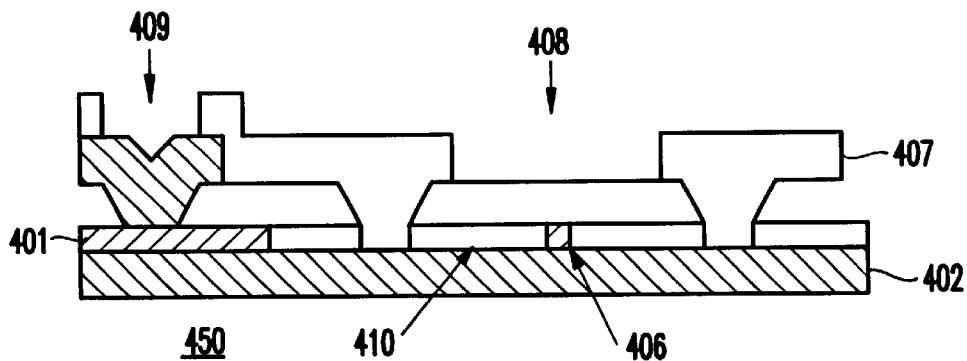

In FIG. 4D, a terminal via (TV) dielectric 407, such as silicon dioxide, is deposited and patterned to form fuse windows 408 and bond pad windows 409 using conventional techniques. When the fuse is blown, laser energy is directed through the fuse window 408 or excessive voltage/current is applied to the fuse element 402 which melts/vaporizes that area of the AlCu alloy to open the fuse.

The specific materials and solutions mentioned above are merely exemplary and, as would be known by one ordinarily skilled and the art given this disclosure, any number of similar materials may be used to form the structure shown in FIG. 4D. Principally, the decision as to which materials are utilized depends on the specific requirements of the integrated circuit device being manufactured.

The void formed on the undercut evacuated region 410 of the layer 401 serves to collect material displaced from layer 402 during the fuse blow process and hence localize ablative damage to adjoining regions in the case of a laser fuse blow or localize damage induced by the vaporization of the fuse in the case of an electrically blown fuse.

Figure 5:
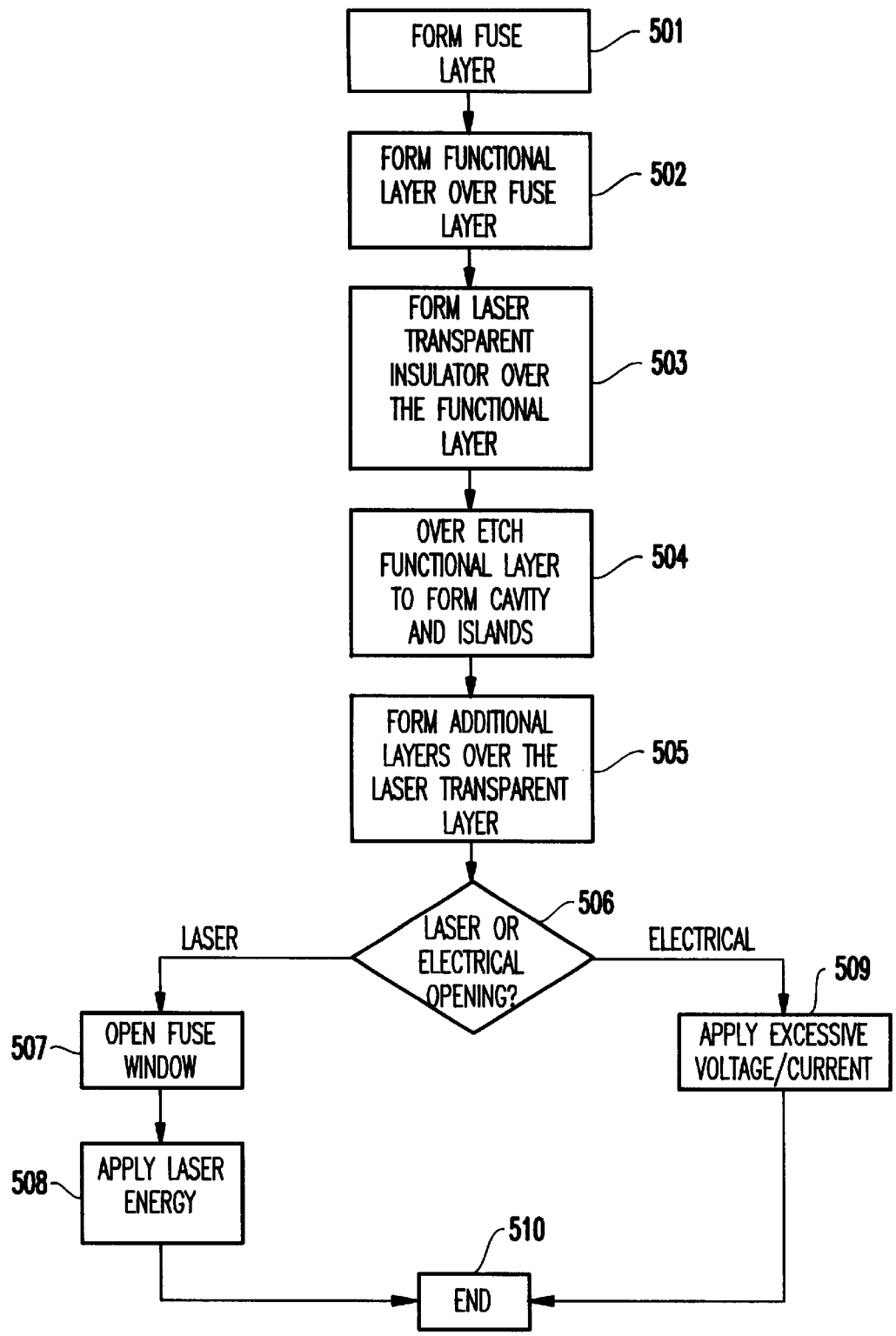
FIG. 5 is a flowchart illustrating a preferred embodiment of the invention.

FIG. 5 is a flowchart illustrating the foregoing embodiment of the invention. More specifically, in item 501 the fuse layer 402 is formed. In item 502, a functional layer, such as the alloy layer 401 is formed over the fuse layer 402. In item 503 a laser transparent material, such as the silicon dioxide 400, is formed above the functional layer 401.

Regardless of the material compositions selected for a given integrated circuit, one feature of the invention (which can be included in any material embodiment of the invention) is that the cavity is positioned between the laser window 408 and the fuse material 402. By locating the cavity in this matter, the surface of the fuse material 402 which initially receives the laser energy is thermally isolated. Therefore, the laser energy will be more concentrated on this surface of the fuse material 402 and cause a more reliable and faster vaporization/melting of the fuse material 402.

To the contrary, conventional cavities are formed below the fuse material (e.g., on a side opposite from the direction of the laser energy). Therefore, with conventional structures, the fuse link surface which first receives the laser energy is in contract with an adjacent layer of material and this surface of the fuse material is not truly thermally isolated as the fuse link in the invention is.

Figure 1:
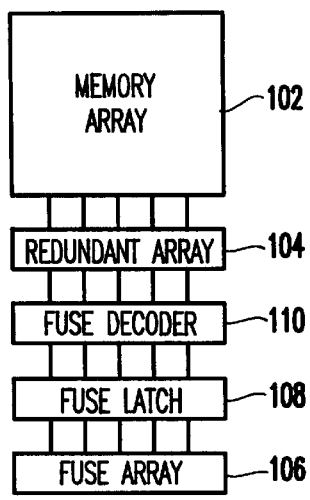
FIG. 1 illustrates a typical dynamic random access memory (DRAM) integrated circuit to facilitate discussion.
Figure 2A:
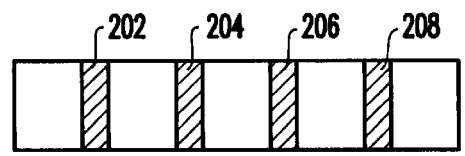
FIG. 2A illustrates a plurality of conventional fuse links in their unblown (i.e., conductive) state.
Figure 2B:
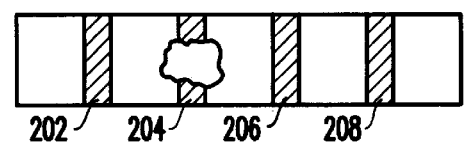
FIG. 2B depicts the fuse links of FIG. 2A in their blown (i.e., nonconductive) state.
Figure 3A:
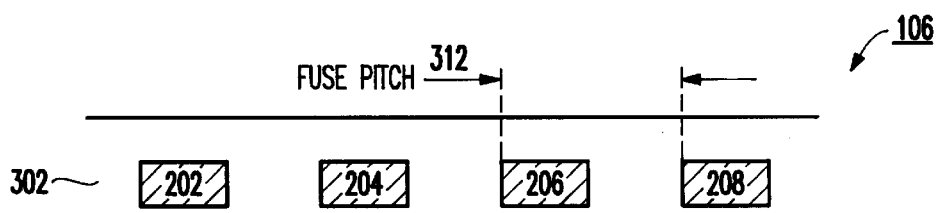
FIGS. 3A and 3B illustrate a plurality of fuse links on a substrate, including the laser spots formed thereon after the fuse setting operation.
Figure 3B:
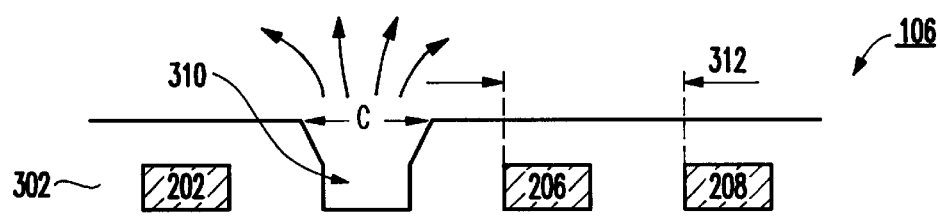

Additionally, whether the fuse link is opened using laser energy or excessive voltage/current, by providing the cavity in a direction toward the laser window 408, the energy and material being expelled by the fuse opening process is directed toward the dielectric material 400 and away from integrated circuit devices which may exist below the fuse material, such as those devices discussed above with respect to FIG. 3B. Therefore, with the invention, any damage which occurs as a result of the fuse opening process (such as cracking or melting) is primarily limited to the contact layer 400. Thus, the chances of damaging integrated circuit devices below the titanium layer 411 is substantially reduced when compared to fuse structures which include a cavity in a direction toward underlying integrated circuit devices.

Regardless of the materials selected to form the fuse material and surrounding structures, another important feature of the invention is the utilization of an existing layer in the formation of the cavity. More specifically, the copper/aluminum alloy 401 in which the cavity 410 is formed, is a layer which is utilized to perform a useful function in a different portion of the integrated circuit device. By carefully selecting reactive agents during the reactive ion etching, such as a previously existing layer (such as the alloy 401 in the present structure) is utilized with the invention to reduce the number of processing steps required to implement the invention.

Additionally, as mentioned above, the islands 406 are allowed to remain in the cavity 410 to help the fuse material 402 absorb the laser energy. In other words, the islands 406 within the cavity 410 concentrate the laser energy transmitted through the laser window 408 and increase the energy absorption within the fuse material 402 at the point of the island 406.

The functional layer 401 is overetched using, for example the isotropic etching process described above, to form the cavity 410 and the islands 406 in item 504. In item 505 additional processing continues to form layers such as the insulating layer 407 and the additional conductive layer 404, 405.

The processing then continues depending upon whether the fuse will be opened electrically or with laser energy, in item 506. If the fuse is to be opened with laser energy, a fuse window 408 is formed over the laser transparent material 400, as shown in item 507. Then, in item 508, laser energy is applied to open the fuse 402. To the contrary, if the fuse is to be opened electrically, excessive voltage/current is applied to the fuse 402 which causes it to open. The process ends at item 510.

Another benefit of this invention is that the inventive fuse structure does not add any additional deposition steps to the conventional process because the fuse uses the existing metal wire stack structure which is used elsewhere on a topical integrated circuit chip as an interconnect structure.

While the invention has been described in terms of preferred embodiments, those skilled in the art will recognize that the invention can be practiced with modification within the spirit and scope of the appended claims.

What is claimed is:

1. A dynamic random access memory integrated circuit comprising:
   a main memory array having main memory array elements;
   a redundant memory array, coupled to said main memory array, including redundant memory array elements;
   at least one laser fuse link selectively substituting at least one of said redundant memory array elements for defective ones of said main memory elements upon application of laser energy; and
   at least one cavity portion positioned between said laser fuse link and a source of said laser energy.

2. The dynamic random access memory in claim 1, further comprising a fuse window allowing said laser energy to reach said fuse link, wherein said cavity is between said fuse link and said fuse window.

3. The dynamic random access memory in claim 2, wherein said cavity directs energy and fuse material from said fuse link toward said fuse window.

4. A dynamic random access memory integrated circuit comprising:
   a main memory array having main memory array elements;
   a redundant memory array, coupled to said main memory array, including redundant memory array elements;
   at least one laser fuse link selectively substituting at least one of said redundant memory array elements for defective ones of said main memory elements upon application of laser energy, said laser fuse link includes a first conductive layer and a second conductive layer above said first conductive layer, wherein said cavity portion is within said second conductive layer; and
   at least one cavity portion positioned between said laser fuse link and a source of said laser energy.

5. A dynamic random access memory integrated circuit comprising:
   a main memory array having main memory array elements;
   a redundant memory array, coupled to said main memory array, including redundant memory array elements;
   at least one laser fuse link selectively substituting at least one of said redundant memory array elements for defective ones of said main memory elements upon application of laser energy; and
   at least one cavity portion positioned between said laser fuse link and a source of said laser energy and conductive islands within said cavity.

6. The dynamic random access memory in claim 5, wherein said conductive islands concentrate laser energy on said fuse link.

7. An integrated circuit comprising:
   primary devices; and
   redundant devices being selective substituted for said primary devices through at least one fuse,
   said fuse comprising:
      a first layer having at least one laser fuse link region;
      a second layer over said first layer; and
      a cavity in said second layer positioned with respect to said laser fuse link region to direct fuse material away from adjacent devices within said integrated circuit.

8. The integrated circuit in claim 7, further comprising a fuse window allowing laser energy to reach said fuse link region, wherein said cavity is between said fuse link region and said fuse window.

9. The integrated circuit in claim 8, wherein said cavity directs energy and fuse material from said fuse link region toward said fuse window.

10. An integrated circuit comprising:
    primary devices; and
    redundant devices being selective substituted for said primary devices through at least one fuse,
    said fuse comprising:
       a first layer having at least one fuse link region;
       a second layer over said first layer;
       an insulating layer over said second layer, wherein said first layer comprises a conductive layer and said second layer comprises a conductive layer; and
       a cavity in said second layer positioned with respect to said fuse link region to direct fuse material away from adjacent devices within said integrated circuit.

11. An integrated circuit comprising:
    primary devices; and
    redundant devices being selective substituted for said primary devices through at least one fuse,
    said fuse comprising:
       a first layer having at least one fuse link region;
       a second layer over said first layer; and
       a cavity in said second layer positioned with respect to said fuse link region to direct fuse material away from adjacent devices within said integrated circuit and conductive islands within said cavity.

12. The integrated circuit in claim 11, wherein said conductive islands concentrate laser energy on said fuse link region.

* * * * *